US008078309B1

(12) United States Patent
Eyre et al.

(10) Patent No.: US 8,078,309 B1
(45) Date of Patent: Dec. 13, 2011

(54) METHOD TO CREATE ARBITRARY SIDEWALL GEOMETRIES IN 3-DIMENSIONS USING LIGA WITH A STOCHASTIC OPTIMIZATION FRAMEWORK

(75) Inventors: Francis B. Eyre, Los Angeles, CA (US); Wolfgang Fink, Montrose, CA (US)

(73) Assignee: The United States of America as represented by the Administrator of the National Aeronautics and Space Administration, Washington, DC (US)

(*) Notice: Subject to any disclaimer, the term of this patent is extended or adjusted under 35 U.S.C. 154(b) by 459 days.

(21) Appl. No.: 12/415,206

(22) Filed: Mar. 31, 2009

Related U.S. Application Data

(60) Provisional application No. 61/072,499, filed on Mar. 31, 2008.

(51) Int. Cl.
*G06F 19/00* (2011.01)
*B29C 39/00* (2006.01)

(52) U.S. Cl. .......... 700/198; 700/98; 700/117; 700/121; 700/197; 430/5; 430/397; 205/118

(58) Field of Classification Search .............. 700/95–98, 700/117, 118, 163, 197, 198; 430/5, 397; 382/154; 345/419; 205/67, 80–82, 118, 205/170; 600/564
See application file for complete search history.

(56) References Cited

U.S. PATENT DOCUMENTS

| | | | |
|---|---|---|---|
| 5,189,777 A | 3/1993 | Guckel et al. | |
| 5,190,637 A | 3/1993 | Guckel | |
| 5,206,983 A | 5/1993 | Guckel et al. | |
| 5,327,033 A | 7/1994 | Guckel et al. | |
| 5,357,807 A | 10/1994 | Guckel et al. | |
| 5,378,583 A | 1/1995 | Guckel et al. | |
| 5,465,220 A * | 11/1995 | Haruki et al. | 347/256 |
| 5,496,668 A | 3/1996 | Guckel et al. | |
| 5,576,147 A | 11/1996 | Guckel et al. | |
| 5,644,177 A | 7/1997 | Guckel et al. | |
| 5,679,502 A * | 10/1997 | Siddons et al. | 430/397 |
| 5,718,618 A | 2/1998 | Guckel et al. | |
| 5,808,384 A | 9/1998 | Tabat et al. | |
| 5,866,281 A | 2/1999 | Guckel et al. | |

(Continued)

OTHER PUBLICATIONS

M.F. Su, I. El-Kady, M.M. Reda Taha, C.G. Christodoulou, A novel integrated method realizing iteratively optimized modeling for proximity field patterning nanolithography, Photonics and Nanostructures—Fundamentals and Applications, V6, No. 1, 7th Intl Symposium on Photonic and Electromagnetic Crystal Structures—PECS-VII, Apr. 2008, pp. 69-80.*

(Continued)

*Primary Examiner* — Dave Robertson
(74) *Attorney, Agent, or Firm* — Mark Homer

(57) ABSTRACT

Disclosed herein is a method of making a three dimensional mold comprising the steps of providing a mold substrate; exposing the substrate with an electromagnetic radiation source for a period of time sufficient to render the portion of the mold substrate susceptible to a developer to produce a modified mold substrate; and developing the modified mold with one or more developing reagents to remove the portion of the mold substrate rendered susceptible to the developer from the mold substrate, to produce the mold having a desired mold shape, wherein the electromagnetic radiation source has a fixed position, and wherein during the exposing step, the mold substrate is manipulated according to a manipulation algorithm in one or more dimensions relative to the electromagnetic radiation source; and wherein the manipulation algorithm is determined using stochastic optimization computations.

20 Claims, 9 Drawing Sheets

U.S. PATENT DOCUMENTS

| | | | |
|---|---|---|---|
| 5,908,719 A | 6/1999 | Guckel et al. | |
| 6,558,882 B2 * | 5/2003 | Koide | 430/397 |
| 6,607,305 B2 | 8/2003 | Fischer et al. | |
| 6,875,544 B1 * | 4/2005 | Sweatt et al. | 430/5 |
| 7,266,803 B2 * | 9/2007 | Chou et al. | 716/51 |
| 7,355,728 B2 * | 4/2008 | Li et al. | 356/625 |
| 7,623,935 B2 * | 11/2009 | Cohen et al. | 700/95 |
| 7,783,371 B2 * | 8/2010 | John et al. | 700/98 |
| 7,894,921 B2 * | 2/2011 | John et al. | 700/95 |
| 7,998,331 B2 * | 8/2011 | Cohen | 205/118 |
| 2005/0240895 A1 * | 10/2005 | Smith et al. | 716/19 |
| 2009/0093874 A1 * | 4/2009 | Cohen | 623/1.35 |

OTHER PUBLICATIONS

Jiangxin Wang. Costas J. Spanos. A Novel Approach for Modeling and. Diagnostics of Lithography Process. Presented to the AEC/APC'2001, Oct. 6-11, 2001, 5pgs.*

Bijoyraj Sahu and Curtis R. Taylor. Emerging Challenges of Microactuators for Nanoscale Positioning, Assembly, and Manipulation. J. Manuf. Sci. Eng.—Jun. 2010—vol. 132, Issue 3, 16 pages.*

Hansen, H.N. Approaches to the Design of Micro Mechanical Systems. CIPR Design Conference, 2011.*

M. Schweiger, S. R. Arridge and D. T. Delpy. Application of the finite-element method for the forward and inverse models in optical tomography. Journal of Mathematical Imaging and Vision, vol. 3, No. 3, 263-283.*

Daoheng Sun, Chengzhi Wang and Wenwang Li, "Adaptive modeling of MEMS system-level simulation based on evolutionary computation", Proc. SPIE 4601, 186 (2001).*

Jing-Quan Liu ÆHong-Wen Sun ÆLing-Han Li Di Chen. A novel method to fabricate complex three-dimensional microstructures. Microsyst Technol (2006) 12: 786-78.*

Zhang, Y. "MEMS Design Synthesis Based on Hybrid Evolutionary Computation," PhD Thesis, Department of Civil and Environmental Engineering, University of California at Berkeley, 2006.*

Triltsch, U.; Buttgenbach, S.; , "Next generation of TCAD environments for MEMS design," Design, Test, Integration and Packaging of MEMS/MOEMS, 2008. MEMS/MOEMS 2008. Symposium on , vol., no., pp. 91-95, Apr. 9-11, 2008.*

N. Metropolis, A.W. Rosenbluth, M.N. Rosenbluth, A.H. Teller, E. Teller, Equation of State Calculation by Fast Computing Machines, J. of Chem. Phys., 21, 1087-1091, 1953.

S. Kirkpatrick, C.D. Gelat, M.P. Vecchi, Optimization by Simulated Annealing, Science, 220, 671-680, 1983.

Stochastic Optimization Framework (SOF) for Computer-Optimized Design, Engineering, and Perforrnance of Multi-Dimensional Systems and Processes, Wolfgang Fink, California Inst Proceedings of the SPIE, vol. 6960, May, 2008.

* cited by examiner

SOF Flowchart *Mask Optimization*

Figure 3 SOF Flowchart

*Beam Exposure/Target Positioning Optimization*

METHOD TO CREATE ARBITRARY SIDEWALL GEOMETRIES IN 3-DIMENSIONS USING LIGA WITH A STOCHASTIC OPTIMIZATION FRAMEWORK

CROSS-REFERENCE TO RELATED APPLICATIONS

This application claims priority from Provisional Application Ser. No. 61/072,499 filed Mar. 31, 2008.

STATEMENT OF GOVERNMENT INTEREST

The invention described hereunder was made in the performance of work under a NASA contract, and is subject to the provisions of Public Law #96-517 (35 U.S.C. 202) in which the Contractor has elected not to retain title.

BACKGROUND OF THE INVENTION

The present invention generally relates to a method of contacting a relatively thick substrate (i.e., having a thickness of greater than or equal to about 0.1 mm) with an energy source wherein the substrate is manipulated in three dimensions translationally (i.e., along an x-, y-, and/or z-axis) and/or rotationally about an x-, y-, and z-axis according to a manipulation movement algorithm such that a complex shape is defined by means of the energy source interacting with the substrate material, wherein the manipulation movement algorithm is determined using a stochastic optimization framework. In an embodiment, the instant invention may create a three dimensional object which can be used as is or as a mold in a substrate using an electromagnetic radiation source, particle beam radiation, a fluid beam, an ionic beam, abrasion, and/or the like in combination with stochastic optimization computations. In particular, the present invention relates to a method of producing molds for micro machines on the order of 0.1 to 10 mm in one or more dimensions using LiGA (Lithographic (lithography), Galvanoformung (electroplating), Abformung (mold-forming)) in combination with a stochastic optimization framework.

The instant disclosure is relative to the micro scale between 0.1 and about 10 mm, up to a very large scale on the order of meters or more, and may be used on biological systems, as well as to produce micro-machine components.

Micro-Electro-Mechanical Systems (MEMS), also referred to herein as micromachines and/or micromachine systems, comprise a plurality of micro-fabricated components. Micro-fabrication technologies fall into 3 main categories: surface micromachining, bulk micromachining, and micromolding.

Surface micromachining technologies include the patterning of thin films that are deposited on substrates, typically silicon. The devices that are fabricated in this manner are made up of elements that have arbitrary shapes along the plane of the substrate, but have straight sidewalls and are typically on the order of 1 micron thick. The most successful devices fabricated in this manner are made up of 2 or 3 layers and have 1 to about 5 moving parts. This method has not been shown to be able to produce a wide range of devices or systems. The finished devices are part of a substrate and are normally not separated from the substrate, which limits the complexity attainable for micromachine systems fabricated in this manner.

Bulk micromachining techniques entail the patterning of substrates, again mostly silicon, by removing material with a variety of etching methods, e.g. 'wet' etching using potassium hydroxide (KOH), tetramethyl ammonium hydroxide (TMAH), ethylenediamine pyrocatechol (EDP), and the like, and/or 'dry' etching using reactive ion etch (RIE) plasmas or gases such as $XeF_2$. These methods produce a range of devices including those that work by means of membranes that deform, cantilevered beams that bend, and recently have been used on SOI wafers to create parts that resemble one-layer surface micromachined devices, but which are much thicker and so function better when the driving force is electrostatic attraction, such as stepper motors. The finished devices also usually remain attached to the substrate and are not normally separated from it, again limiting the complexity and range of systems able to be fabricated with these methods.

Micromolding technologies entail methods of creating patterned voids in various materials that are used as 'molds' that are subsequently used to fabricate a micromachine part either by electroplating (e.g., LiGA, Su-8 and the like) or by various injection molding techniques. These technologies are capable of creating parts an order of magnitude or more larger than either surface or bulk technologies, and are independent of substrates allowing the parts to be assembled into arbitrarily complex, truly 3-dimensional structures. These techniques are not capable, however, of creating miniature parts of arbitrary geometries, because the "z" or 'thickness' dimension, which is the dimension perpendicular to the plane of the substrate, has always been a straight sidewall as a necessary artifact of the technology. Thus, such micromachine parts such as gears can be produced using micromolding, but not spheres, or other parts having a non-linear z-axis or having reentrant angles (e.g., an hour-glass shape) from a single photoresist.

U.S. Pat. Nos. 5,378,583 and 5,496,668 are generally directed to the formation of microstructures, a preformed sheet of photoresist, such as polymethylmethacrylate (PMMA), which is strain free, may be milled down before or after adherence to a substrate to a desired thickness. The photoresist is patterned by exposure through a mask to radiation, such as X-rays, and developed using a developer to remove the photoresist material which has been rendered susceptible to the developer. Micrometal structures may be formed by electroplating metal into the areas from which the photoresist has been removed. The photoresist itself may form useful microstructures, and can be removed from the substrate by utilizing a release layer between the substrate and the preformed sheet which can be removed by a remover which does not affect the photoresist. Multiple layers of patterned photoresist can be built up to allow complex three dimensional microstructures to be formed.

Likewise, U.S. Pat. No. 5,908,719 is generally directed to a procedure for achieving accurate alignment between an X-ray mask and a device substrate for the fabrication of multi-layer microstructures. A first photoresist layer on the substrate is patterned by a first X-ray mask to include first alignment holes along with a first layer microstructure pattern. Mask photoresist layers are attached to second and subsequent masks that are used to pattern additional photoresist layers attached to the microstructure device substrate. The mask photoresist layers are patterned to include mask alignment holes that correspond in geometry to the first alignment holes in the first photoresist layer on the device substrate. Alignment between a second mask and the first photoresist layer is achieved by assembly of the second mask onto the first photoresist layer using alignment posts placed in the first alignment holes in the first photoresist layer that penetrate into the mask alignment holes in the mask photoresist layers. The alignment procedure is particularly applicable to the fabrication of multi-layer metal microstructures using deep X-ray lithography and electroplating. The alignment procedure may be extended to multiple photoresist layers and larger device heights using spacer photoresist sheets between subsequent masks and the first photoresist layer that are joined together using alignment posts.

Accordingly, the method by which complex three-dimensional components may be fabricated involves building up various layers of a mold to produce the desired structure. However, this approach is not only time consuming, but also requires each of the sidewalls to be linear along the z-axis, thus the shape of the wall along the z-axis will be a stepped approximation having a resolution equal to the thickness of the layers, and will not be a true continuous curve.

None of the technologies known in the art are capable of fabricating micromachine parts of arbitrary shape in all dimensions from a single photoresist. As such, the vision of creating true micromachines with many moving parts and a high level of complexity has not been realized. Accordingly, there exists a need for a method of producing micromachine molds and by extension micromachine parts having a continuous non-linear z-axis, preferably from a single layer of a photoresist.

SUMMARY OF THE INVENTION

In one aspect of the present invention, a method of exposing a substrate in a three dimensional pattern comprises the steps of:

providing a substrate for exposure; exposing the substrate in an exposing step, the exposing step comprising contacting a portion of the substrate with an energy source for a period of time sufficient to render the portion of the substrate susceptible to a developer to produce a modified substrate wherein the energy source has a fixed position, and wherein during the exposing step, the substrate is manipulated according to a manipulation algorithm in one or more translational dimensions and/or rotational dimensions relative to the energy source; and wherein the manipulation algorithm is determined using stochastic optimization computations.

In another aspect of the present invention, a method of making a three dimensional mold comprises the steps of:
A method of making a three dimensional mold comprising the steps of:

providing a mold substrate;

exposing the substrate in an exposing step, the exposing step comprising contacting a portion of the mold substrate with an electromagnetic radiation source, a particle beam, or a combination thereof, for a period of time sufficient to render the portion of the mold substrate susceptible to a developer to produce a modified mold substrate; and
developing the modified mold substrate in a developing step comprising contacting the modified mold substrate with one or more developing reagents to remove the portion of the mold substrate rendered susceptible to the developer from the mold substrate to produce the mold having a desired mold shape, wherein the electromagnetic radiation source and/or the particle beam has a fixed position, and wherein during the exposing step, the mold substrate is manipulated according to a manipulation algorithm in one or more translational dimensions and/or rotational dimensions relative to the electromagnetic radiation source and/or to the particle beam; and wherein the manipulation algorithm is determined using stochastic optimization computations.

In still another aspect of the present invention an apparatus to expose a substrate in a three dimensional pattern comprises: a movable platform which has 6 degrees of freedom in communication with an energy source, wherein a substrate attached to the movable platform is exposed in an exposing step, the exposing step comprising contacting a portion of the substrate with the energy source for a period of time sufficient to render the portion of the substrate susceptible to a developer to produce a modified substrate wherein the energy source has a fixed position, and wherein during the exposing step, the substrate is manipulated according to a manipulation algorithm in one or more translational dimensions and/or rotational dimensions relative to the energy source; and wherein the manipulation algorithm is determined using stochastic optimization computations.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
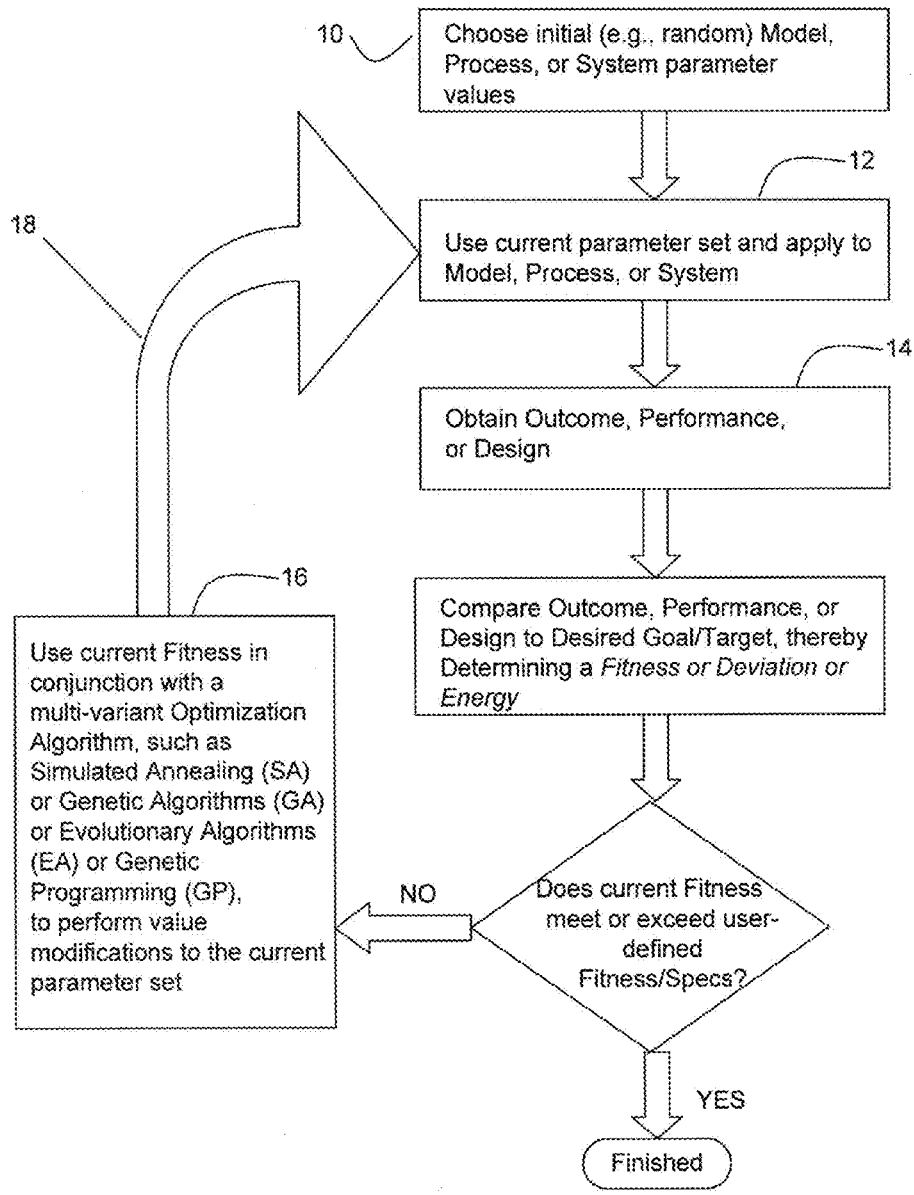
FIG. 1 is a block diagram showing the steps of the stochastic optimization framework of the instant disclosure.

The following detailed description is of the best currently contemplated modes of carrying out the invention. The description is not to be taken in a limiting sense, but is made merely for the purpose of illustrating the general principles of the invention, since the scope of the invention is best defined by the appended claims.

In the following description, numerous specific details are set forth to provide a thorough understanding of the present invention. However, it will be obvious to those skilled in the art that the present invention may be practiced without such specific details. In other instances, well-known devices have been shown in block diagram form in order not to obscure the present invention in unnecessary detail. For the most part, details unnecessary to obtain a complete understanding of the present invention have been omitted in as much as such details are within the skills of persons of ordinary skill in the relevant art.

The instant disclosure provides a method of exposing a substrate in a three dimensional pattern comprising the steps of: providing a substrate or exposure; exposing the substrate in an exposing step, the exposing step comprising contacting a portion of the substrate with an energy source for a period of time sufficient to render the portion of the substrate susceptible to a developer to produce a modified substrate wherein the energy source has a fixed position, and wherein during the exposing step, the substrate is manipulated according to a manipulation algorithm in one or more dimensions relative to the energy source; and/or wherein the energy source is manipulated according to a manipulation algorithm in one or more dimensions relative to the substrate; and wherein the manipulation algorithm is determined using stochastic optimization computations.

In an embodiment, the substrate may be a living biological tissue, wherein a portion of the tissue (e.g., a tumor) may be exposed by an energy source such as electromagnetic radiation (e.g., x-rays) to render the tumor inactive. In another embodiment, the substrate may be a polymeric material suitable for producing micromachine components.

The instant disclosure further provides a solution to creating micromachine components having an arbitrary geometry (e.g., a thickness dimension of linear and/or non-linear shape) utilizing micromolding. In an embodiment, the micromolds may be produced by exposing a mold substrate to an electromagnetic radiation source to produce a component from a modified mold substrate, wherein a portion of the mold substrate which is contacted with the electromagnetic radiation is rendered susceptible to a developing system. Upon contacting this modified mold substrate with the developing system, the portion of the mold substrate contacted with the radiation source can be physically removed from the mold substrate to produce a mold disposed within and/or around the mold substrate. The mold may be a "negative" or a cavity which after being subsequently filled with a material produces a micromachine component, and/or the mold may be a "positive" formation, which may be subsequently used to produce a negative mold in another substrate utilizing a variety of techniques known in the art. In an embodiment, a LiGA process may be utilized to produce the mold.

The term "LiGA" is an acronym taken from the first letters of the German words for lithography, electroplating and mold making. LiGA is a form of deep X-ray lithography, which typically involves a substrate which is covered by a thick photoresist (i.e., the mold substrate.) The term "photoresist" refers to a light-sensitive material used to form a patterned coating on a surface, and is used interchangeably with the term "mold substrate." Photoresists suitable for use herein include positive resists, wherein the portion of the photoresist that is exposed above its critical exposure limit by the energy source (e.g., an electromagnetic radiation source, a particle beam source, a fluidized jet, and/or the like) becomes soluble to the photoresist developer system such that the portion of the photoresist that is under exposed remains insoluble to the photoresist developer. A photoresist may also be a negative resist, wherein the portion of the photoresist that is exposed to the radiation source becomes relatively insoluble to the photoresist developer, such that the unexposed portion of the photoresist is dissolved away from the photoresist developer.

In an embodiment, the photoresist of the instant disclosure may be on the order of several hundred microns, up to several millimeters in thickness. However, the instant process is not limited to the micro to millimeter scale. The application of a stochastic optimization framework to determine a manipulation algorithm to contact a substrate having an arbitrary geometry with an energy source is limited only by the available energy source and the ability to move the substrate itself. Accordingly, the instant application may apply to the micromachine scale of 0.1 to about 10 mm, all the way up to meters or even tens of meters for use in forming molds and/or methods of treatment in biological systems wherein a source of energy is contacted with a substrate to remove and/or incapacitate a portion of the substrate (e.g., a tumor) having an arbitrary geometry.

In an embodiment, the molds of the instant invention comprise one or more axis in the x-dimension, the y-dimension, and the z-dimension (the thickness) of greater than or equal to about 0.1 mm, preferably greater than or equal to about 0.5 mm, preferably greater than or equal to about 1 mm, preferably greater than or equal to about 1 mm, preferably greater than or equal to about 2 mm, preferably greater than or equal to about 3 mm, preferably greater than or equal to about 4 mm, preferably greater than or equal to about 5 mm, preferably greater than or equal to about 6 mm, preferably greater than or equal to about 7 mm, preferably greater than or equal to about 8 mm, preferably greater than or equal to about 9 mm, preferably greater than or equal to about 10 mm, preferably greater than or equal to about 20 mm, preferably greater than or equal to about 30 mm, preferably greater than or equal to about 40 mm, preferably greater than or equal to about 50 mm, preferably greater than or equal to about 60 mm, preferably greater than or equal to about 70 mm, preferably greater than or equal to about 80 mm, preferably greater than or equal to about 90 mm, preferably greater than or equal to about 100 mm, preferably greater than or equal to about 200 mm, preferably greater than or equal to about 400 mm, preferably greater than or equal to about 500 mm, preferably greater than or equal to about 600 mm, preferably greater than or equal to about 700 mm, preferably greater than or equal to about 800 mm, preferably greater than or equal to about 900 mm, preferably greater than or equal to about 1000 mm.

In addition, the molds of the instant invention may comprise one or more axis in the x-dimension, the y-dimension, and the z-dimension less than or equal to about 1000 mm, preferably less than or equal to about 900 mm, preferably less than or equal to about 800 mm, preferably less than or equal to about 700 mm, preferably less than or equal to about 600 mm, preferably less than or equal to about 500 mm, preferably less than or equal to about 400 mm, preferably less than or equal to about 300 mm, preferably less than or equal to about 200 mm, preferably less than or equal to about 100 mm, preferably less than or equal to about 90 mm, preferably less than or equal to about 80 mm, preferably less than or equal to about 70 mm, preferably less than or equal to about 60 mm, preferably less than or equal to about 50 mm, preferably less than or equal to about 40 mm, preferably less than or equal to about 30 mm, preferably less than or equal to about 20 mm, preferably less than or equal to about 10 mm, preferably less than or equal to about 9 mm, preferably less than or equal to about 8 mm, preferably less than or equal to about 7 mm, preferably less than or equal to about 6 mm, preferably less than or equal to about 5 mm, preferably less than or equal to about 4 mm, preferably less than or equal to about 3 mm, preferably less than or equal to about 2 mm, preferably less than or equal to about 1 mm, preferably less than or equal to about 0.5 mm.

In another embodiment, the arbitrary geometry desired to be contacted within a substrate comprises one or more axis in the x-dimension, the y-dimension, and the z-dimension (the thickness) of greater than or equal to about 1 cm up to 10 m or more.

In an embodiment, the mold substrate of the instant invention is attached to a separate base substrate during the exposing step. In another embodiment of the instant invention, the mold substrate of the instant invention is not attached to a separate base substrate during the exposing step.

In an embodiment, the mold substrate comprises polymethylmethacrylate (PMMA), an epoxy-based photoresists e.g., KMPR (Microchem, MA, USA), SU-8 (Microchem, MA, USA), Foturan (mikroglas technik AG, Germany), photo-patternable silicon, and/or combinations thereof. In a preferred embodiment, the mold substrate comprises polymethylmethacrylate having a density of about 1.18 kg/m$^3$ or greater, more preferably having a density of about 1.18 to about 1.19 kg/m$^3$.

In another embodiment, the substrate is a biological system.

The energy source used to contact the substrate may include an electromagnetic radiation energy source (e.g., light, x-rays, and the like), a particle beam energy source (e.g., a proton beam, fast atom bombardment energy beam, electron beam, and/or the like), and/or a fluid energy source, (e.g., a water jet, a jet of abrasive material, a plasma jet, and/or the like), and/or the energy may be in the form of an abrasive member including a grinding wheel, rotating cutter, abrasive probe and/or the like. Unless otherwise specified, the term electromagnetic radiation is used as a representative energy source. However, it is to be understood that any energy source capable of contacting a substrate such that a modified substrate is produced is applicable to the disclosure herein.

When the instant method uses LiGA, x-rays are preferred. Since X-ray photons are much more energetic than optical photons, X-ray photons are preferably utilized during exposure of the instant mold substrates (photoresists.) Furthermore, since X-ray photons are short wavelength particles, diffraction effects which typically limit device dimensions to two or three wavelengths of the exposing radiation are absent for mask dimensions above 0.1 micron. If one adds to this the fact that X-ray photons are absorbed by atomic processes, standing wave problems, which typically limit exposures of thick photoresists by optical means, become a nonissue for X-ray exposures.

In an embodiment, the electromagnetic radiation source is preferably X-rays produced using a synchrotron, which yields high flux densities—several watts per square centimeter—combined with excellent collimation to produce thick photoresist exposures without any horizontal runout. As such, locally exposed patterns are produced which have a very high selectivity between exposed and unexposed photoresist.

In an embodiment, and in a typical LiGA process, the mold substrate is preferably polymethylmethacrylate (PMMA), which is preferably utilized with a developing system. It has been observed that a megasonic bath (i.e., having a frequency of about 1 to about 10 MHz) is useful in removing the exposed mold substrate from the mold when the geometries of the mold are complex. In a LiGA process, this "deep X-ray lithography" may be combined with electroplating to form high aspect ratio structures. To do so requires that the substrate be furnished with a suitable plating base prior to photoresist application and/or after the mold substrate has been modified. Commonly, this involves a sputtered film of adhesive metal, such as chromium or titanium, which is followed by a thin film of metal which is suitable for electroplating the metal to be plated. In appropriate cases, the use of an initial layer of adhesive metal is not necessary. Exposure through a suitable mask and development are followed by electroplating. In an embodiment, the mask shape may change over time, wherein the mask shape is determined using a stochastic optimization framework (e.g., a motor driven iris.)

In another embodiment, (known in the art as the "Eyre Process"), a mold is produced within a mold substrate without a base substrate attached. The modified mold substrate is then attached to a base substrate which is subsequently utilized in an electroplating or other process to produce a positive component having the mold shape. This process results, after cleanup, in metal structures with very high aspect ratios. For a more in-depth description of the LiGA process, attention. is directed to U.S. Pat. Nos. 6,607,305; 5,908,719; 5,866,281; 5,808,384; 5,718,618; 5,679,502; 5,644,177; 5,576,147; 5,496,668; 5,378,583; 5,357,807; 5,327,033; 5,206,983; 5,190,637; and 5,189,777, and the references cited therein, all of which are incorporated by reference.

However, it has been discovered that the mold substrate does not need to be attached to a base, thus the micromachine components produced according to the instant invention are not necessarily attached to a substrate. Furthermore, the instant invention allows for non-linear shapes along the z-axis of the mold (referred to herein as the "thickness"), which may be accomplished by moving of the mold substrate in one or more translational dimensions (i.e., along an x-axis, a y-axis and/or a z-axis) and/or one or more rotational axis along an x-axis, a y-axis and/or a z-axis relative to the radiation source (which is preferably fixed in space) while the mold substrate is being exposed by the radiation source; and/or by moving the mold substrate relative to a fixed radiation source in combination with a "mask" or pattern located in-between the mold substrate and the radiation source; and/or moving the mold substrate and a mask, either independently or in unison relative to the radiation source while the mold substrate is being exposed by the radiation source; and/or moving or re-directing the radiation source relative to the mold substrate and/or a mask while the mold substrate is being exposed by the radiation source; and/or any combination thereof.

In an embodiment, a method of making a three dimensional mold comprises the steps of 1) providing a mold substrate;
2) exposing the substrate in an exposing step, the exposing step comprising contacting a portion of the mold substrate with an electromagnetic radiation source either directly or through a mask .disposed between the mold substrate and the electromagnetic radiation source for a period of time sufficient to render the portion of the mold substrate susceptible to a developer to produce a modified mold substrate; and
3) developing the modified mold substrate in a developing step comprising contacting the modified mold substrate with one or more developing reagents to remove the portion of the mold substrate rendered susceptible to the developer from the mold substrate to produce the mold having a desired mold shape, wherein at least one of the mold substrate, the electromagnetic radiation source and/or the mask is moved relative to the other components during the exposing step.

Accordingly, the instant invention differs in at least one respect from a typical LiGA process in that the substrate and/or a mask may be moved in all three translational directions and/or rotational directions relative to the radiation source. It has been unexpectedly discovered that manipulation of the mold substrate relative to the radiation beam is required to produce the desired mold and/or other effect within the designated area. Accumulating low doses inside the mold material or other substrate is central to the idea. The radiation beam changes the mold material everywhere it strikes. If the beam were powerful enough or the exposure long enough all of the material on the beam-path would be critically dosed and removed during development. Using less powerful beams or shorter exposure times, only that part of the mold material where several beam-paths converge becomes developable. Thus, summing the dose past the critical exposure level at that point, one can dictate which parts of the mold are able to be developed. Accordingly, the mask and/or the substrate must be moved during the exposing step. Also, a plurality of mask may be needed to achieve any single developable shape, as may conditioning of the substrate (e.g., water content, temperature, and the like.) In an embodiment, the shape of the mask may also change during the exposing step, wherein the shape of the mask is determined using a stochastic optimization framework.

In an embodiment, the mold substrate to be fabricated is mounted on a scanner, which will move the substrate up, down, and sideways (i.e., in all three dimensions) and/or rotation about all three axis, in the synchrotron beam. Unlike conventional LiGA, however, the instant mold substrate need not always be essentially perpendicular to the path of the radiation beam, which in the case of a synchrotron beam is typically shaped like a rectangle on the order of 10 cm long and 1 mm wide.

This process is referred to herein simply as the 3D LiGA Inverse Tomographic Process. In an embodiment, such a process may be accomplished by mounting the mold substrate onto a movable platform which has 6 degrees of freedom (three translational and three rotational.)

However, the path in which a mold substrate must be moved involves a plurality of factors. This is a highly complex process in that there is a problem in deciding what path along which the substrate has to travel in the beam in order to create the 'void' pattern desired (and/or the positive hardened patter in the case of a negative photoresist), given all the various parameters involving the beam, substrate, dose accumulation, and constraints of the hardware moving the substrate. This path of travel is referred to herein as the manipulation algorithm.

Tomography is the technique of creating 3-dimensional images by combining information contained in 2-dimensional images. LiGA Inverse Tomography is the technique of using the information in a 3-dimensional map to create a set of 2-dimensional image "exposures" that will describe the positions and motions of a 6 degree-of-freedom scanner.

In other words: using an inherently 2-dimensional patterning process, and realizing that patterns may be created in the 3rd dimension by moving that substrate appropriately, the instant disclosure is able to produce micromachine components once the proper path of movement (the proper manipulation algorithm) including both translations and rotations, for the substrate to travel has been calculated.

In an embodiment a substrate is mounted on a computer controlled scanner capable of Movement along arbitrary paths, including rotations (akin to a computer numerical controlled (CNC) machine.)

To calculate manipulation algorithm it has been found necessary to integrate a variety of considerations including:

1) deterministic algorithms; such as the implementation of Lambert-Beer's law for the modeling and calculation of the dosage accumulation within the substrate due to its exposure to the synchrotron beam;

2) stochastic/evolutionary computational optimization techniques, which may include Simulated Annealing and/or Genetic Algorithms, which provide for the inverse tomographic generation and optimization of the exposure history/plan of the substrate (the manipulation algorithm), as well as for the design and optimization of the gold mask shape for the synchrotron beam; and 3) various output modules such as one for the graphical display of the current exposure profile, as well as an exposure protocol that can be interfaced with the computer-controllable/programmable scanner.

In an embodiment, software operates on a 3-dimensional, user-definable grid, which has a spatial resolution that is user adjustable to at or below the spatial resolution required for the patterning. The core of the software package is the application of stochastic optimization computations, also referred to as stochastic/evolutionary computational optimization techniques and/or a stochastic optimization framework.

In an embodiment, the term stochastic optimization computations includes operation with an adequately formulated objective function which compares a current and/or simulated shape of an exposed substrate with a predetermined and/or desired target shape and then calculates the difference or the "fit" between the two. The return-value of this objective function drives the evolutionary optimization process that generates the list of timed (responsible for exposure depth) translational and rotational movements of the substrate mounted to the scanner, and/or the shape of a mask which obscures some of the radiation beam, which ultimately yields the desired target shape of the exposed substrate, within previously determined user-definable tolerances.

As used herein, the term Stochastic Optimization (SO), is interchangeable with the term Stochastic Optimization Framework (SOF), which is also interchangeable with the term Stochastic Optimization Computations, which includes optimization algorithms which incorporate probabilistic (random and/or guided random) elements, point mutations, and the like applied to the choice of parameter values.

Stochastic Optimization Computations contrast with so-called "deterministic" optimization methods. Stochastic Optimization is a forward type progression, wherein the starting points (initial values of parameters) may be totally random or may be a best guess, and are modified using values selected from a valid range and/or an infinite range until an acceptable fit is obtained. For more information see "Stochastic Optimization Framework (SOF) for Computer-Optimized Design, Engineering, and Performance of Multi-Dimensional Systems and Processes", Wolfgang Fink, California Institute of Technology, which is hereby incorporated by reference in its entirety.)

Stochastic Optimization differs from a "reverse engineering" approach wherein the starting point of the reverse engineering approach is the desired outcome and selections are made to achieve the underlying parameter values that would yield that desired outcome. In general, the geometries are too complex to be solved by a reverse engineering "down hill" approach. Stochastic Optimization Computations suitable for use herein may include stochastic approximation methods, wherein a family of iterative stochastic optimization algorithms are used to find zeroes or extrema of functions which cannot be computed directly, but only estimated via noisy observations. Examples include the Monte Carlo optimization methods, which are a class of computational algorithms that rely on repeated random sampling to compute their results. Monte Carlo methods are often used when simulating physical and mathematical systems. Because of their reliance on repeated computation and random or pseudo-random numbers, Monte Carlo methods are most suited to calculation by a computer. Monte Carlo methods tend to be used when it is infeasible or impossible to compute an exact result with a deterministic algorithm. Other examples include:

the "Metropolis" optimization methods (see N. Metropolis, A. W. Rosenbluth, M. N. Rosenbluth, A.H. Teller, E. Teller, Equation of State Calculation by Fast Computing Machines, *J. of Chem. Phys.*, 21, 1087-1091, 1953), Simulated Annealing (see S. Kirkpatrick, C. D. Gelat, M. P. Vecchi, Optimization by Simulated Annealing, *Science*, 220, 671-680, 1983);

The "Holland" optimization method (see J. H. Holland, *Adaptation in Natural and Artificial Systems*, The University of Michigan Press, Ann Arbor, Mich., 1975);

Genetic optimization methods (see D. E. Goldberg, Genetic Algorithms in Search, Optimization and Machine Learning. Addison-Wesley, 1989); and/or Genetic Programming optimization methods (see J. R. Koza, *Genetic Programming: On the Programming of Computers by Means of Natural Selection*, Cambridge, Mass.: The MIT Press, 1992), all of which are incorporated by reference herein for teachings directed to optimization methods.

Other optimization methods suitable for use herein include Robbins-Monro and Kiefer-Wolfowitz algorithms.

In the Robbins-Monro algorithm, the function M(x) for which one wishes to find the value of x, $x_0$, satisfying $M(x_0)=\alpha$. However, what is observable is not M(x), but rather a random variable N(x) such that $E(N(x)|x)=M(x)$. The algorithm is then to construct a sequence which satisfies:

$$x_{n+1}=x_n+a_n(\alpha-N(x_n)).$$

Wherein $a_1, a_2, \ldots$ is a sequence of positive step sizes. Robbins and Monro proved that, if N(x) is uniformly bounded, M(x) is nondecreasing, $M'(x_0)$ exists and is positive, and if $a_n$ satisfies a set of bounds (fulfilled if one takes $a_n=1/n$), then $x_n$ converges in $L^2$ (and hence also in probability) to $x_0$.

In the Kiefer-Wolfowitz algorithm, the maximum, $x_0$, of the unknown M(x) and constructs a sequence $x_1, x_2, \ldots$ such that $$x_{n+1}=x_n+a_n[(N(x_n+c_n)-N(x_n-c_n)]/c_n.$$

Here, $a_1, a_2$, is a sequence of positive step sizes which serve the same function as in the Robbins-Monro algorithm, and $c_1, c_2, \ldots$ is a sequence of positive step sizes which are used to estimate, via finite differences, the derivative of M.

As shown in the Figures including FIG. 1, in an embodiment, a Stochastic Optimization Framework (SOF) includes a cycle comprising the steps of:

10 determining starting parameters, which initially may be totally random or which may be "seeded" depending on the specific conditions;

12 model the process system;

14 determining outcome performance relative to a predetermined goal;

16 changing components of the system to produce a new set of starting parameters based on an optimization engine; and then 18, repeating steps 12, 14, and 16 to determine if a better fit (a better performance relative to a predetermined goal) is obtained until an acceptable manipulation algorithm is determined such that a particular component produced by a mold is within the needed tolerances of that component for a particular end-use application.

In particular, suitable stochastic optimization computations include a plurality of iterations wherein each of the plurality of iterations includes the steps of a) calculating a first manipulation algorithm comprising a series of manipulations to expose the substrate to produce a first mold shape;

b) determining the first mold shape produced by the first manipulation algorithm in the mold substrate to produce a first mold shape;

c) comparing the first mold shape to the desired mold shape to produce a first mold shape fitness;

d) comparing the first mold shape fitness to a predetermined mold shape fitness; and e) incorporating at least a portion of the first manipulation algorithm and/or a totally new manipulation algorithm based on random selections into a subsequent manipulation algorithm based on a stochastic optimization engine and repeating steps a), b), c), and d) until the first mold shape fitness is within a predetermined range of fitness compared to the desired mold shape.

Figure 2:
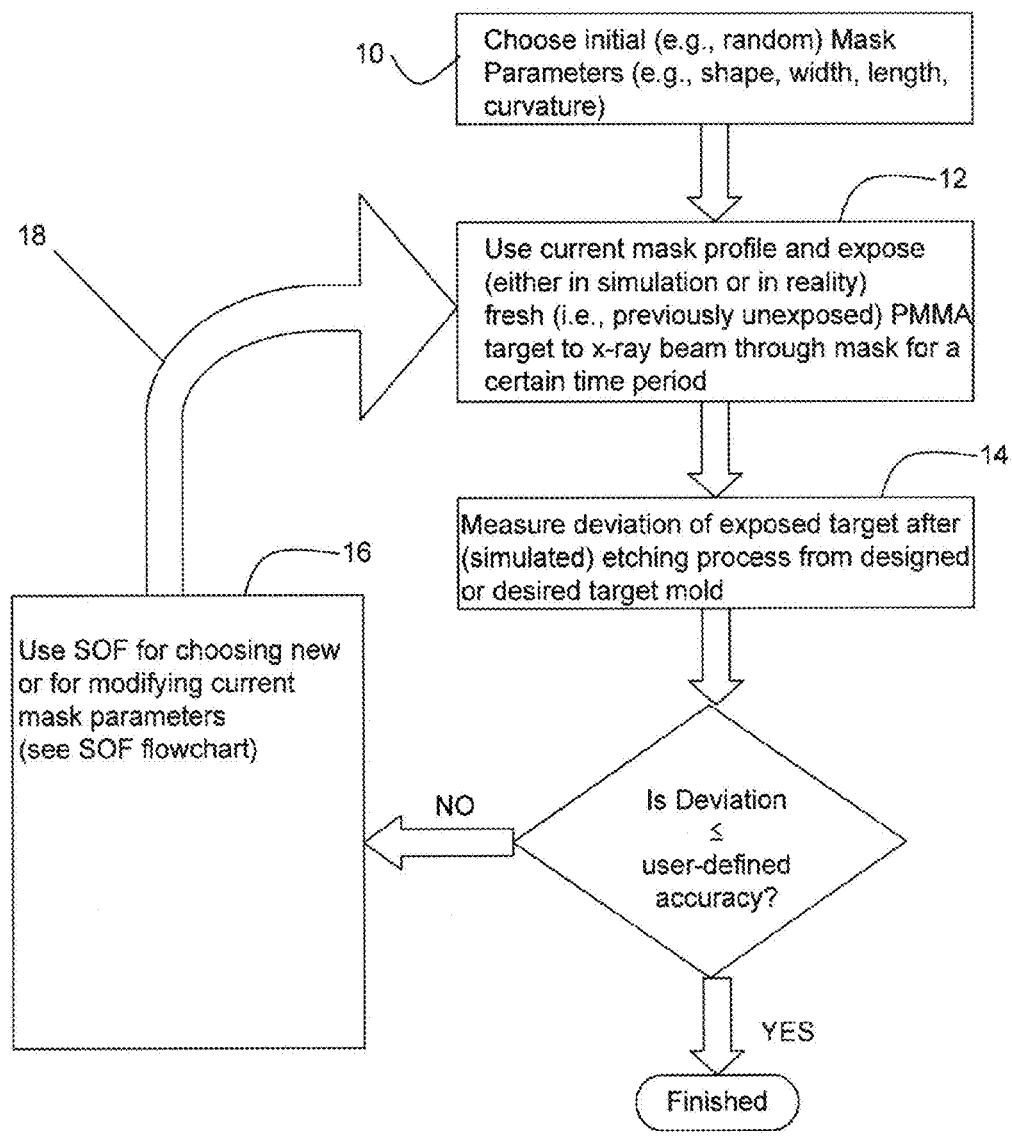
FIG. 2 is a block diagram showing the steps of an embodiment of the stochastic optimization framework of the instant disclosure.
Figure 3:
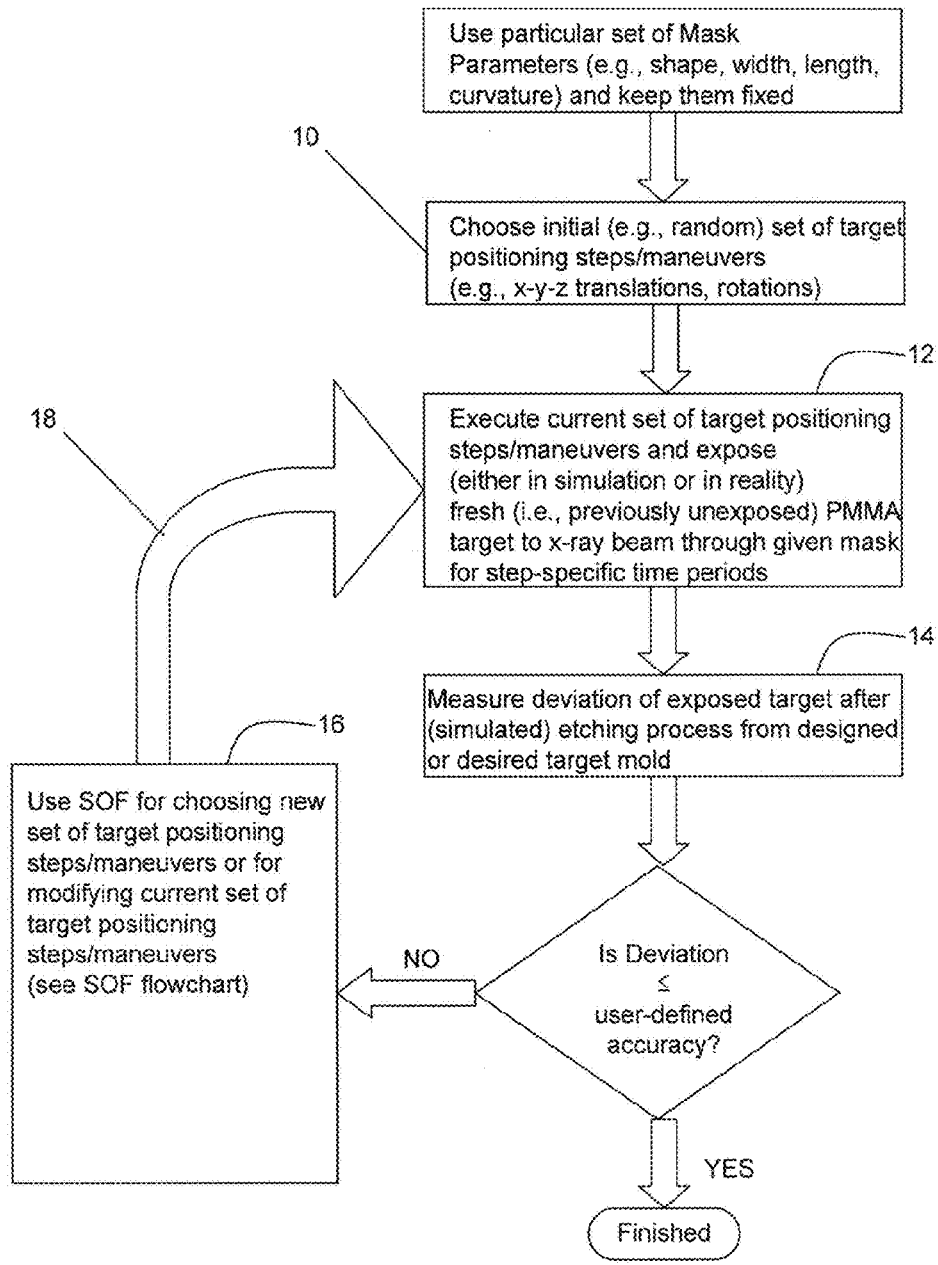
FIG. 3 is a block diagram showing the steps of an alternative embodiment of the stochastic optimization framework of the instant disclosure.
Figure 4:
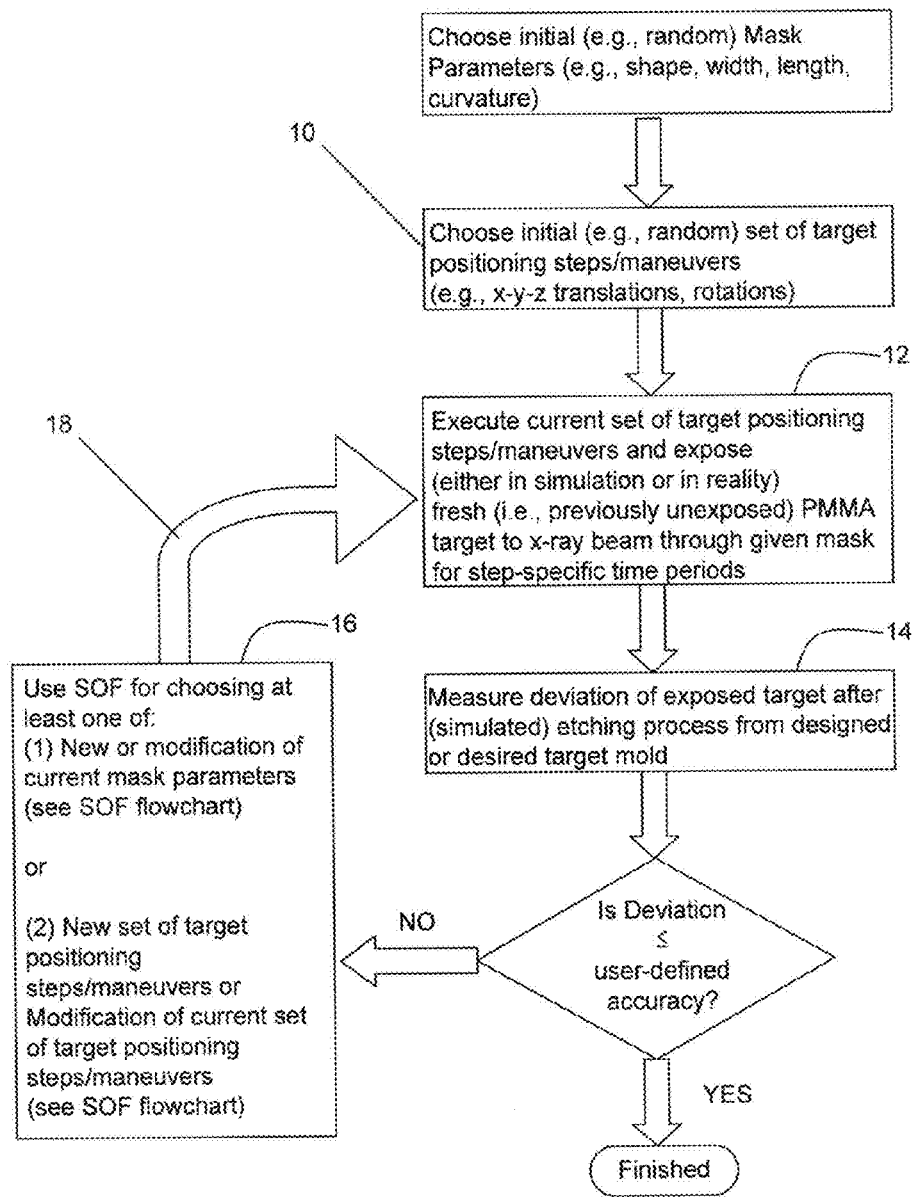
FIG. 4 is a block diagram showing the steps of an alternative embodiment of the stochastic optimization framework of the instant disclosure.

Similar to FIG. 1, FIG. 2 depicts an embodiment of the instant disclosure, wherein the steps of defining the mask parameters are determined using a stochastic optimization framework. FIG. 3 depicts an embodiment of the instant disclosure, wherein the steps of determining the Manipulation algorithm for the mold substrate are determined using a stochastic optimization framework. FIG. 4 depicts an embodiment of the instant disclosure, wherein the steps of defining both the mask parameters and the manipulation algorithm of the mold substrate are determined using a stochastic optimization framework.

Stochastic optimization computations thus allow for efficient sampling of the entire model-intrinsic parameter space by repeatedly running the respective model forward (e.g., on a single, cluster, or parallel computer) and by comparing the outcomes against the desired outcome, which results in a fitness measure. The goal of the SOF is to optimize this fitness. This approach is in sharp contrast to optimizing around a point design, which is often the case in engineering. Deterministic optimization techniques, such as gradient-based steepest-descent methods, are powerful and efficient in problems that exhibit only few local minima in the solution space.

However, when dealing with multiple or infinite numbers of local minima as is the case herein, optimization engines utilizing heuristic stochastic optimization methods, such as Simulated Annealing related algorithms, Genetic Algorithms, other Evolutionary and/or Genetic Programming Algorithms, are the preferred methods of choice in determining the manipulation algorithm in the instant invention because of their capability to overcome local minima.

In an embodiment, the SOF utilizes one or more Simulated Annealing algorithms as the optimization engine. As used herein, Simulated Annealing (SA) refers to a generic probabilistic metaheuristic for the global optimization problem of applied mathematics, namely locating a good approximation to the global minimum of a given function in an infinite or finite search space. It may also be used when the search space is discrete or continuous. It has been discovered that simulated annealing is preferred herein since it is more effective than exhaustive enumeration given that the goal is merely to find an acceptably good solution in a fixed amount of time, rather than the best possible solution.

In an embodiment of the instant invention, each step of the SA algorithm replaces the current solution by a random, probabilistically modified, and/or altered solution, chosen with a probability that depends on the difference between the corresponding function values and on a global parameter that is gradually decreased during the process. The dependency is such that the current solution changes almost randomly when the parameter is large, but increasingly "downhill" as this value goes to zero. The allowance for "uphill" moves has been discovered to prevent this optimization engine from becoming stuck at a local minimum or local minima as do other methods of optimization. Of course, an essentially infinite number of algorithms exist within the bounds of the SA algorithm.

In another embodiment, the optimization engine may include a genetic algorithm (GA) which may be used within the stochastic optimization computations to find exact or approximate solutions to optimization and search problems. Genetic algorithms useful herein include those categorized in the art as global search heuristics. Genetic algorithms are a particular class of evolutionary algorithms (also known in the art as evolutionary computation) that use techniques inspired by evolutionary biology such as inheritance, mutation, selection, and crossover (also called recombination).

Genetic algorithms and/or genetic programming algorithms as utilized herein are preferably implemented as a computer simulation in which a population of abstract representations of candidate solutions to an optimization problem evolves toward better solutions (i.e., a better fit between the dimensions of the mold and the desired outcome.) In an embodiment, the evolution may start from a population of randomly generated values and happens in discrete generations (iterations.) In each generation, the fitness of every individual in the population is evaluated, multiple individuals are stochastically selected from the current population (based on their fitness), and modified (recombined and possibly randomly mutated) to form a new population. The new population is then used in the next iteration of the algorithm. In an embodiment, the algorithm terminates when a satisfactory fitness level has been reached (e.g., a mold which produces a component within the tolerances required by the end use of that component.)

A suitable genetic algorithm may include:

1. a representation of the solution domain, which may be the dimensions of the desired component, and 2. a fitness function to evaluate the solution domain, which may include the tolerances of various aspects of the component.

The fitness function (also referred to as the energy function and/or the objective function) is a measure of the fit of the representative to the desired outcome. Once the fitness function is defined, GA proceeds to initialize a population of solutions randomly, then improve it through repetitive application of mutation, crossover, inversion and selection operators. Initially, many individual solutions are randomly generated to form an initial population. The population size depends on the nature of the problem, but typically contains several hundreds or thousands of possible solutions. Traditionally, the population is generated randomly, covering the entire range of possible solutions (the search space). In an embodiment, the solutions may be "seeded" in areas where optimal solutions are likely to be found.

In an embodiment, the optimization engine may include various other evolutionary algorithms (EA). As used herein, an EA is an optimization engine which uses some mechanisms inspired by biological evolution: reproduction, mutation, recombination, and selection. Candidate solutions to the optimization problem play the role of individuals in a population, and the fitness function determines the environment within which the solutions "live". Evolution of the population then takes place after the repeated application of the above operators. Artificial evolution (AE) describes a process involving individual evolutionary algorithms; EAs are individual components that participate in an AE. Evolutionary algorithms perform well approximating solutions to all types of problems because they ideally do not make any assumption about the underlying fitness landscape.

Other optimization engines useful within the SOF of the instant invention utilized herein include:

differential evolution algorithms, which are based on vector differences; and/or particle swarm optimizations, which are based on the ideas of animal flocking behavior; and/or ant colony optimizations, which are based on the ideas of ant foraging by pheromone communication to form path; and/or invasive weed optimization algorithms, which are based on the ideas of weed colony behavior in searching and finding a suitable place for growth and reproduction; and/or harmony search algorithms, which are based on the ideas of musicians behavior in searching for better harmonies; and/or genetic programming algorithms, which are an evolutionary algorithm-based methodology inspired by biological evolution to find computer programs that perform a user-defined task. It is a specialization of genetic algorithms where each individual is a computer program. Therefore it is a machine learning technique used to optimize a population of computer programs according to a fitness landscape determined by a program's ability to perform a given computational task; and/or Gaussian adaptation algorithms, which are based on information theory, and/or the like. All of which are readily known to one of skill in the art.

In an embodiment, the stochastic optimization engine is selected from the group consisting of a simulated annealing algorithm, a genetic algorithm, an evolutionary algorithm, a differential evolution algorithm, a particle swarm optimization algorithm, an ant colony optimization algorithm, an invasive weed optimization algorithm, a harmony search algorithm, genetic programming algorithms, a Gaussian adaptation algorithm, a derivative thereof, or a combination thereof.

Examples

Figure 5:
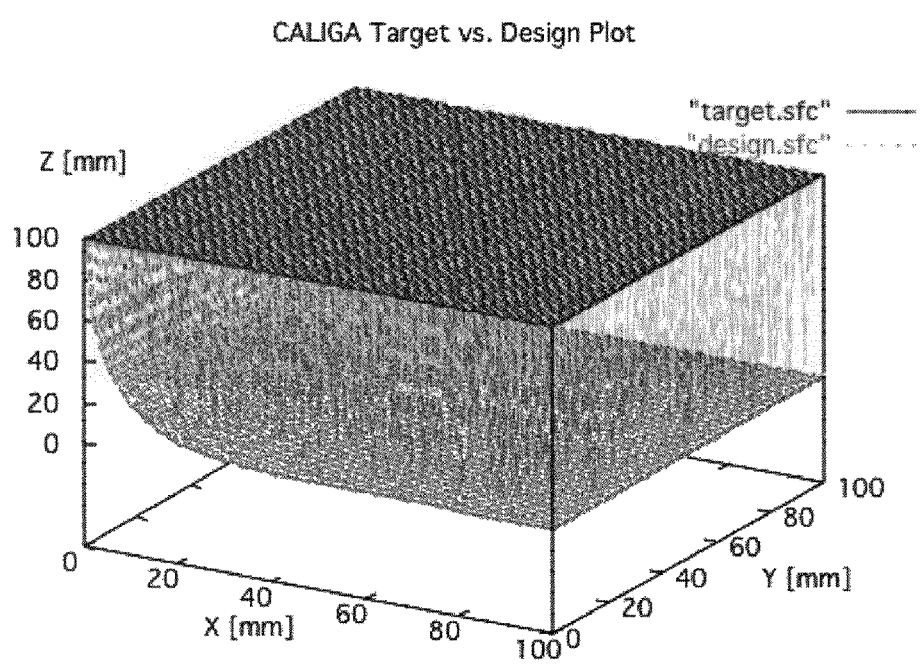
FIG. 5 is an iteration of a graphical representation of a LiGA simulation using a Stochastic Optimization Framework according to the instant disclosure.
Figure 6:
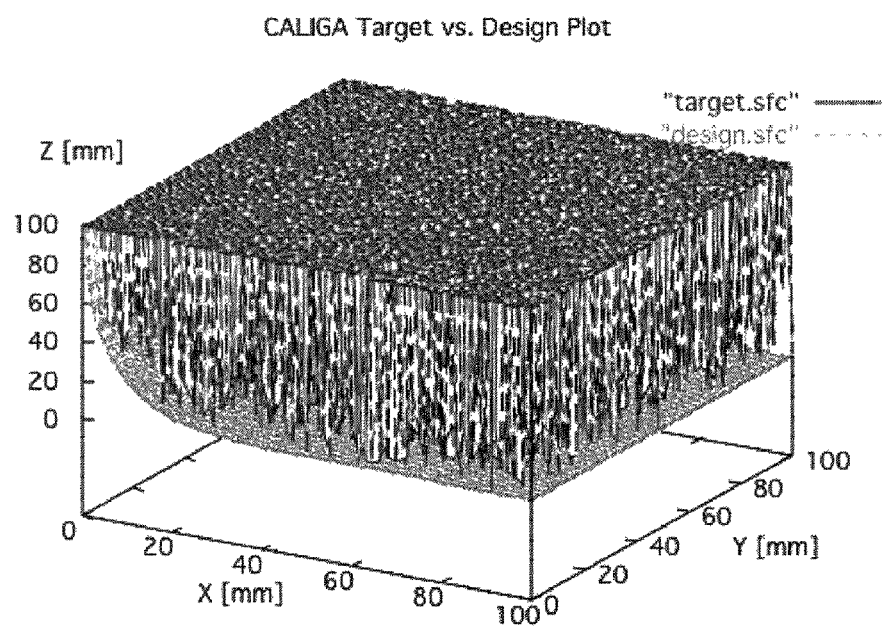
FIG. 6 is an iteration of a graphical representation of a LiGA simulation using a Stochastic Optimization Framework according to the instant disclosure.
Figure 7:
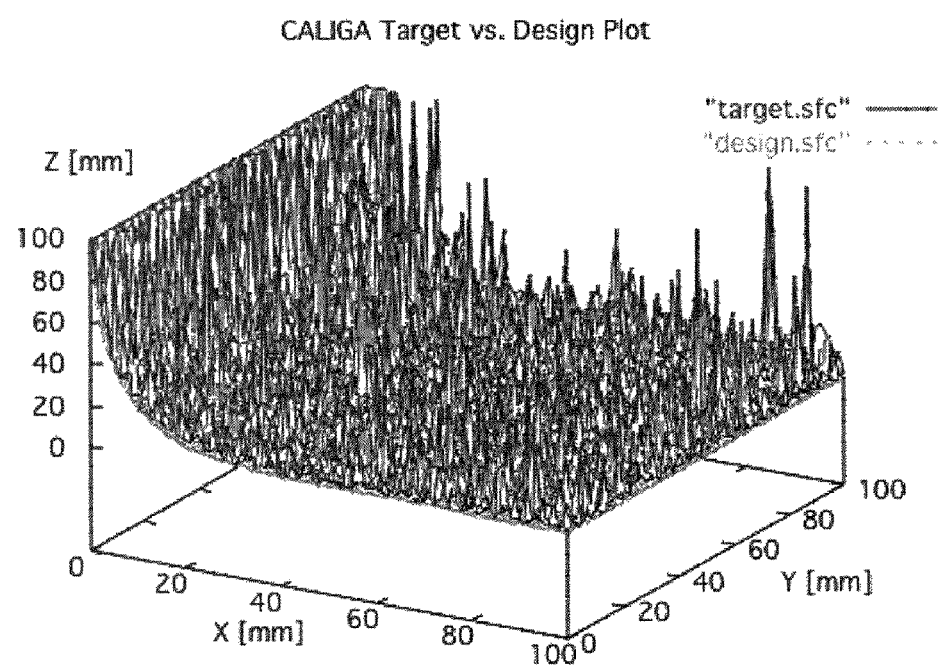
FIG. 7 is an iteration of a graphical representation of a LiGA simulation using a Stochastic Optimization Framework according to the instant disclosure.
Figure 8:
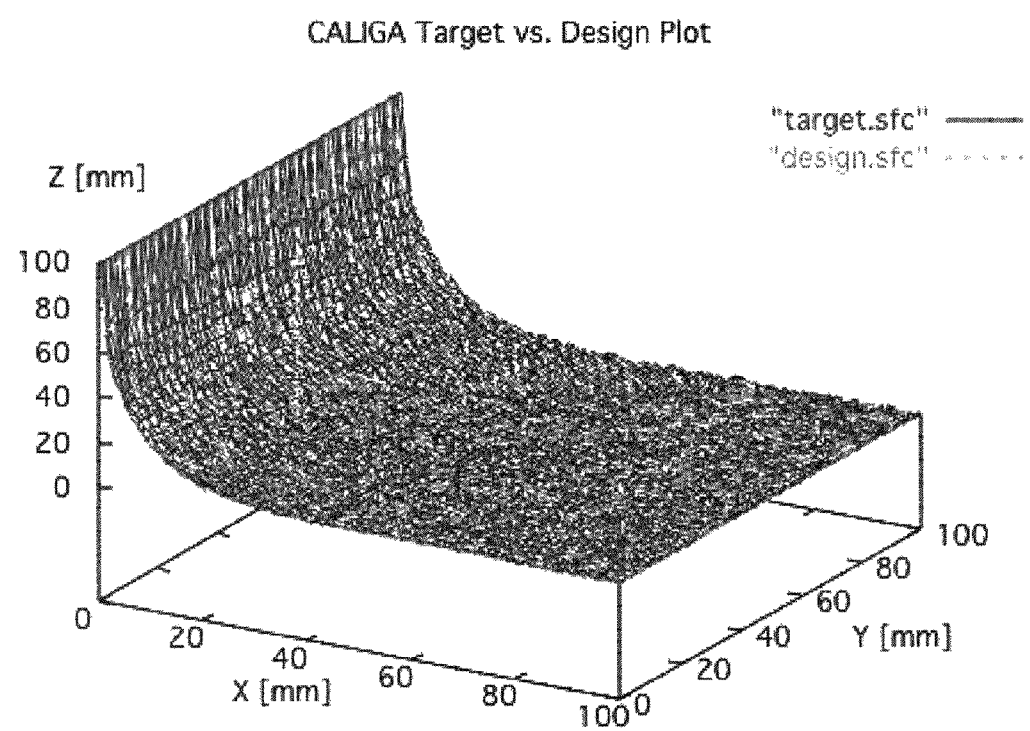
FIG. 8 is an iteration of a graphical representation of a LiGA simulation using a Stochastic Optimization Framework according to the instant disclosure.
Figure 9:
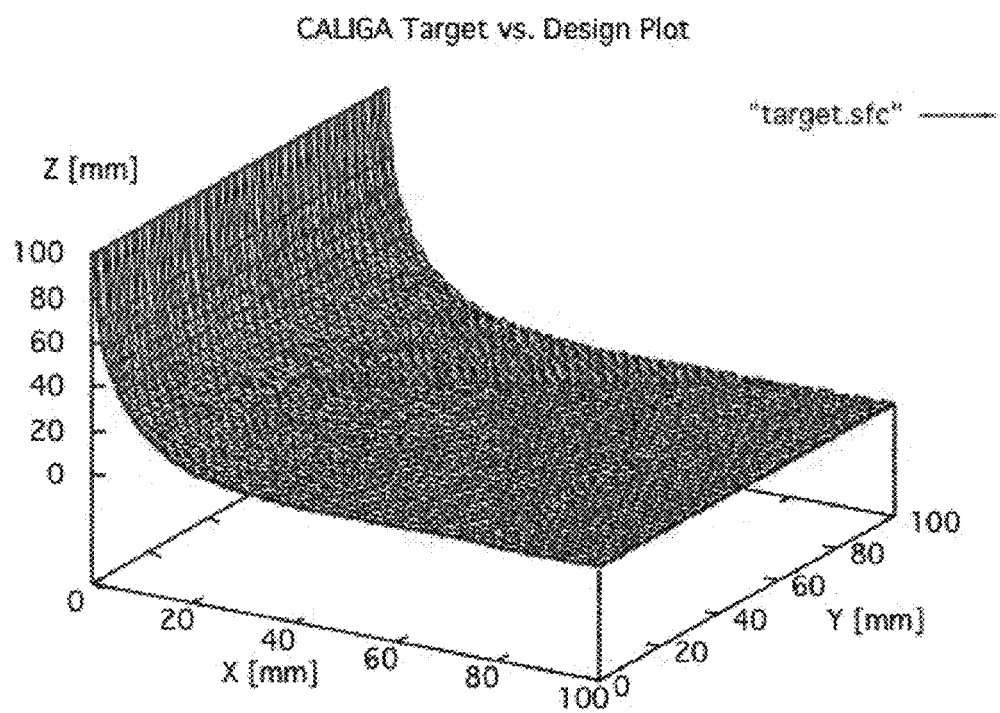
FIG. 9 is an iteration of a graphical representation of a LiGA simulation using a Stochastic Optimization Framework according to the instant disclosure.

To demonstrate the utility of the instant invention, a stochastic optimization framework was applied to a target mold design to be produced using LiGA. Using the standard "C" programming language, a software package was created that reads an external file describing the designed/desired target mold as a 3D point grid/cloud. Using a SOF with SA as the optimization engine, a pre-initialized discretized rectangular block (i.e., 3D point grid/cloud), representing the unexposed mold substrate, was exposed to point-shaped simulated synchrotron X-ray beams. Hereby the x/y-location where the X-ray beam is hitting the substrate is determined via the SOF as well as the exposure time for each beam. The dose accumulation is calculated by assuming a simple $1/(z^2)$ intensity-decay law, with z being the penetration depth. In this simulation all X-ray beams hit the substrate at a 90 degree angle (i.e., perpendicular to the substrate surface and parallel to the z-axis, which is the direction of the X-ray beam). No other exposure angles were included in this initial proof-of-concept simulation. At this point, no rotation of the mold substrate via SOF was performed, only x- and y-translations. No modification of the mask shape via SOF was performed. The mask shape was a pinhole in this particular simulation and kept fixed throughout the entire simulation. A X-ray beam exposure was accepted if the substrate damage depth was smaller or equal to the desired depth that was given by the designed/desired target mold. It was rejected otherwise. Once the substrate has been exposed sufficiently to approximate the designed/desired target mold shape within user-defined accuracy, the simulation stopped. While the simulation was ongoing, snapshots in time of the currently achieved mold-shape (after an assumed etching process, respectively) were graphically displayed. FIGS. 5, 6, 7, 8, and 9 show snapshots of the resultant exposure process wherein the design surface (design.sfc) is approximated by the target surface (target.sfc) in a LiGA simulation using a stochastic optimization framework. FIG. 5 represents the starting approximation, FIGS. 6, 7, and 8 are various iterations, and FIG. 9 represents the final or acceptable solution.

It should be understood, of course, that the foregoing relates to preferred embodiments of the invention and that modifications may be made without departing from the spirit and scope of the invention as set forth in the following claims.

We claim:

1. A method of exposing a substrate in a three dimensional pattern comprising the steps of:
providing a substrate for exposure;
exposing the substrate in an exposing step, the exposing step comprising contacting a portion of the substrate with an energy source for a period of time sufficient to render the portion of the substrate susceptible to a developer to produce a modified substrate wherein the energy source has a fixed position, and wherein during the exposing step, the substrate is manipulated according to a manipulation algorithm in one or more translational dimensions and/or rotational dimensions relative to the energy source; and wherein the manipulation algorithm is determined using stochastic optimization computations.

2. The method of claim 1, wherein the substrate is a polymeric mold substrate.

3. The method of claim 1, wherein the energy source comprises an electromagnetic radiation energy source, a particle beam energy source, or a combination thereof.

4. A method of making a three dimensional mold comprising the steps of
providing a mold substrate;
exposing the substrate in an exposing step, the exposing step comprising contacting a portion of the mold substrate with an electromagnetic radiation source, a particle beam, or a combination thereof, for a period of time sufficient to render the portion of the mold substrate susceptible to a developer to produce a modified mold substrate; and
developing the modified mold substrate in a developing step comprising contacting the modified mold substrate with one or more developing reagents to remove the portion of the mold substrate rendered susceptible to the developer from the mold substrate to produce the mold having a desired mold shape, wherein the electromagnetic radiation source and/or the particle beam has a fixed position, and wherein during the exposing step, the mold substrate is manipulated according to a manipulation algorithm in one or more translational dimensions and/or rotational dimensions relative to the electromagnetic radiation source and/or to the particle beam; and wherein the manipulation algorithm is determined using stochastic optimization computations.

5. The method of claim 4, wherein at least one developing mask is placed between the electromagnetic radiation source and the mold substrate during the exposing step, and wherein the shape of the at least one developing mask is determined using stochastic optimization computations.

6. The method of claim 4, wherein the substrate is a polymeric mold substrate.

7. The method of claim 5, wherein the at least one developing mask is manipulated separately from the mold substrate, in tandem with the mold substrate, or a combination thereof, in at least one translational dimension and/or rotational dimension relative to the electromagnetic radiation source and/or the particle beam during the exposing step.

8. The method of claim 5, wherein the stochastic optimization computations include a plurality of iterations wherein each of the plurality of iterations includes the steps of:
a) calculating a first manipulation algorithm comprising a series of manipulations to expose the substrate to produce a first mold shape;
b) determining the first mold shape produced by the first manipulation algorithm in the mold substrate to produce a first mold shape;
c) comparing the first mold shape to the desired mold shape to produce a first mold shape fitness;
d) comparing the first mold shape fitness to a predetermined mold shape fitness; and
e) incorporating at least a portion of the first manipulation algorithm, or a new manipulation algorithm into a subsequent manipulation algorithm based on a stochastic optimization engine and repeating steps a), b), c), and d) until the first mold shape fitness is within a predetermined range of fitness compared to the desired mold shape.

9. The method of claim 8, wherein the first mold shape determined in step b) is simulated using computational models, and wherein the simulated first mold shape is compared to the desired mold shape using computational models.

10. The method of claim 8, wherein the stochastic optimization engine is selected from the group consisting of a simulated annealing algorithm, a genetic algorithm, an evolutionary algorithm, a differential evolution algorithm, a particle swarm optimization algorithm, an ant colony optimization algorithm, an invasive weed optimization algorithm, a harmony search algorithm, genetic programming, a Gaussian adaptation algorithm, a derivative thereof, or a combination thereof.

11. The method of claim 4, wherein the electromagnetic radiation source is produced using a synchrotron beam.

12. The method of claim 4, wherein the mold substrate comprises poly methyl methacrylate.

13. The method of claim 4, wherein the mold has an x-dimension of about 0.1 to about 100 mm, a y-dimension perpendicular to the x-dimension of about 0.1 to about 100 mm, and a thickness z-dimension perpendicular to a plane formed by the x-dimension and the y-dimension of about 0.1 to about 100 mm, wherein at least a portion of the z-dimension of the mold shape was formed in the thickness of the mold substrate during the exposing step.

14. The method of claim 13, wherein the mold has a continuous non-linear surface in the thickness z-dimension.

15. The method of claim 4, wherein the mold is comprised from a single mold substrate.

16. The method of claim 4, wherein the mold substrate is not attached to a base substrate during the exposing step.

17. The method of claim 4, wherein a plurality of masks are utilized during the exposing step.

18. The method of claim 4, wherein at least one mask is utilized during the exposing step, and wherein the at least one mask shape changes over time.

19. The method of claim 18, wherein the at least one mask shape is determined using a stochastic optimization framework.

20. An apparatus to expose a substrate in a three dimensional pattern comprising:
a movable platform which has 6 degrees of freedom in communication with an energy source, wherein a substrate attached to the movable platform is exposed in an exposing step, the exposing step comprising contacting a portion of the substrate with the energy source for a period of time sufficient to render the portion of the substrate susceptible to a developer to produce a modified substrate wherein the energy source has a fixed position, and wherein during the exposing step, the substrate is manipulated according to a manipulation algorithm in one or more translational dimensions and/or rotational dimensions relative to the energy source; and wherein the manipulation algorithm is determined using stochastic optimization computations.

* * * * *